United States Patent
Hashimoto

(10) Patent No.: US 12,451,356 B2
(45) Date of Patent: Oct. 21, 2025

(54) MANUFACTURING METHOD FOR SEMICONDUCTOR DEVICE

(71) Applicant: FUJI ELECTRIC CO., LTD., Kanagawa (JP)

(72) Inventor: Tatsuya Hashimoto, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 654 days.

(21) Appl. No.: 17/864,358

(22) Filed: Jul. 13, 2022

(65) Prior Publication Data

US 2023/0077430 A1   Mar. 16, 2023

(30) Foreign Application Priority Data

Sep. 14, 2021   (JP) .................. 2021-149736

(51) Int. Cl.
*H01L 21/265* (2006.01)
*H10D 62/13* (2025.01)
*H10D 62/17* (2025.01)

(52) U.S. Cl.
CPC ....... *H01L 21/2652* (2013.01); *H10D 62/153* (2025.01); *H10D 62/157* (2025.01); *H10D 62/393* (2025.01)

(58) Field of Classification Search
None
See application file for complete search history.

(56) References Cited

U.S. PATENT DOCUMENTS

| | | | |
|---|---|---|---|
| 2002/0151143 A1 | 10/2002 | Shiozawa | |
| 2004/0121605 A1* | 6/2004 | Maydan | H01L 21/31662 257/E21.268 |
| 2008/0197398 A1* | 8/2008 | Komukai | H10D 1/692 257/E21.409 |
| 2013/0012033 A1 | 1/2013 | Kabe | |
| 2013/0193493 A1* | 8/2013 | Yamazaki | H10B 10/00 257/288 |
| 2016/0240504 A1 | 8/2016 | Sakaguchi | |
| 2017/0186600 A1* | 6/2017 | Ostermaier | H01L 21/30612 |
| 2017/0229552 A1* | 8/2017 | Fujita | H10D 64/254 |
| 2017/0287774 A1* | 10/2017 | Abe | H01L 21/02255 |
| 2021/0272797 A1* | 9/2021 | Kodama | H10D 12/481 |
| 2022/0238655 A1* | 7/2022 | Okumura | H10D 62/158 |

FOREIGN PATENT DOCUMENTS

| | | | |
|---|---|---|---|
| JP | 2002313905 A | 10/2002 | |
| JP | 2011199003 A | 10/2011 | |
| JP | 2011219503 A | 11/2011 | |
| JP | 2016152317 A | 8/2016 | |

* cited by examiner

*Primary Examiner* — Alexander G Ghyka

(57) ABSTRACT

Provided is a manufacturing method for a semiconductor device including forming a first electrode layer on a front surface of a wafer, implanting, into an outer peripheral region of the front surface of the wafer, a heavy ion of an element in third and subsequent rows of a periodic table, forming an oxide film in the outer peripheral region into which the heavy ion has been implanted, and forming a second electrode layer on the first electrode layer by plating. A dose of the heavy ion may be 1E15 cm$^{-2}$ or more. A depth of an implantation range of the heavy ion into the wafer may be 0.02 μm or more. The heavy ion may be an As ion, a P ion, or an Ar ion.

20 Claims, 15 Drawing Sheets

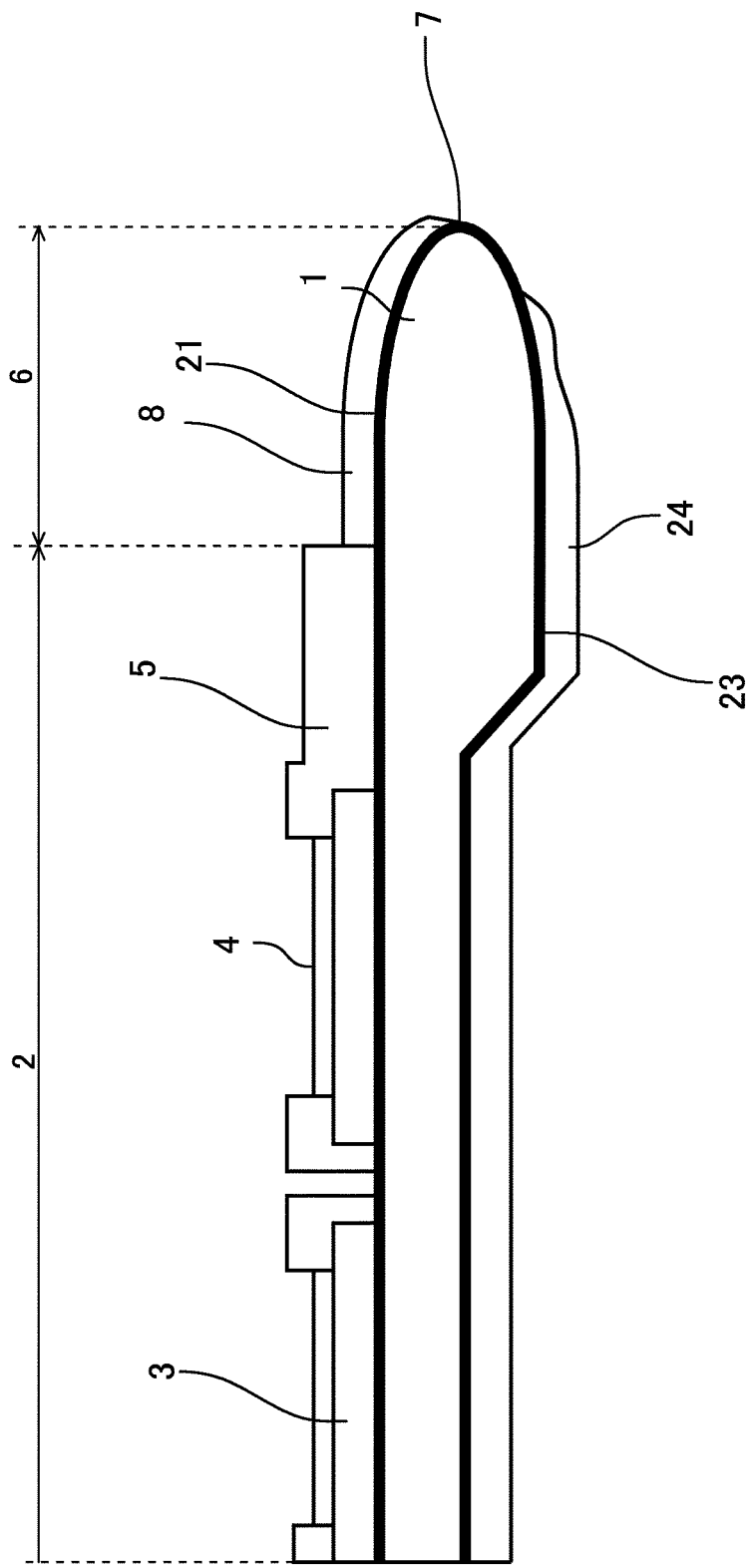

MANUFACTURING METHOD FOR SEMICONDUCTOR DEVICE

The contents of the following Japanese patent application(s) are incorporated herein by reference:
NO. 2021-149736 filed in JP on Sep. 14, 2021

BACKGROUND

1. Technical Field

The present invention relates to a manufacturing method for a semiconductor device.

2. Related Art

Patent Document 1 discloses that an insulation portion required for electroless nickel plating is produced by performing electrical insulation by covering an outer peripheral edge of a semiconductor wafer.

PRIOR ART DOCUMENT

Patent Document

[Patent Document 1] Japanese Patent Application Publication No. 2011-219503

BRIEF DESCRIPTION OF THE DRAWINGS

FIG. 3J is a cross sectional view showing an example of the wafer in each step of the manufacturing method for a semiconductor device according to an example.

DESCRIPTION OF EXEMPLARY EMBODIMENTS

Hereinafter, the invention will be described through embodiments of the invention, but the following embodiments do not limit the invention according to claims. In addition, not all of the combinations of features described in the embodiments are essential for means to solve the problem in the invention.

Figure 1:
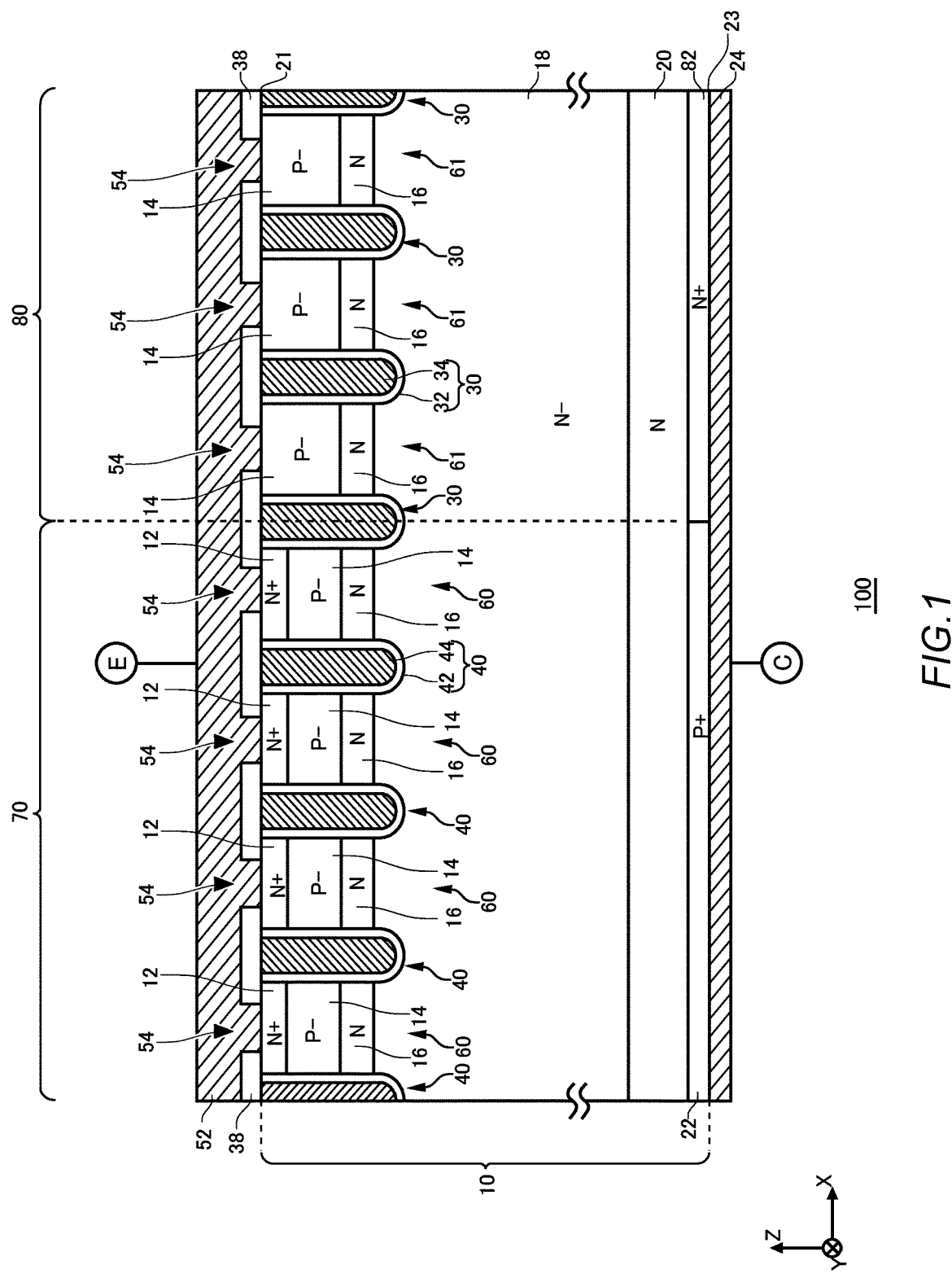
FIG. 1 is a cross sectional view showing an example of a semiconductor device 100 that is manufactured by a manufacturing method for a semiconductor device according to an example.

FIG. 1 is a cross sectional view showing an example of a semiconductor device 100 that is manufactured by a manufacturing method for a semiconductor device according to an example. The semiconductor device 100 may be an insulated gate field effect transistor (MOSFET: Metal Oxide Semiconductor Field Effect Transistor), an insulated gate bipolar transistor (IGBT: Insulated Gate Bipolar Transistor), a free-wheeling diode (FWD: Free Wheel Diode), a reverse conducting insulated gate bipolar transistor (RC-IGBT: Reverse Conducting IGBT) that has functions of these devices, or the like. As an example, the semiconductor device 100 shown in FIG. 1 is an RC-IGBT. The semiconductor device 100 includes a semiconductor substrate having a transistor portion 70 including the IGBT as a transistor element, and a diode portion 80 including the FWD as a diode element.

FIG. 1 is a cross section in a trench array direction passing through an emitter region 12, a base region 14, and a gate trench portion 40 and a dummy trench portion 30. The semiconductor device 100 of the present example has a semiconductor substrate 10, an interlayer dielectric film 38, an emitter electrode 52, and a collector electrode 24, in the cross section shown in FIG. 1.

The interlayer dielectric film 38 is provided on a front surface 21 of the semiconductor substrate 10. The interlayer dielectric film 38 is a dielectric film of silicate glass or the like to which an impurity such as boron or phosphorus is added. The interlayer dielectric film 38 may be in contact with the front surface 21, and another film such as an oxide film may be provided between the interlayer dielectric film 38 and the front surface 21. The interlayer dielectric film 38 is provided with a contact hole 54 in a passing through manner.

The emitter electrode 52 is provided on the front surface 21 of the semiconductor substrate 10 and an upper surface of the interlayer dielectric film 38. The emitter electrode 52 is electrically connected to the front surface 21 by the contact hole 54 of the interlayer dielectric film 38. Inside the contact hole 54, a plug (not shown) of tungsten (W) or the like may be embedded via a barrier metal film.

The collector electrode 24 is provided on a back surface 23 of the semiconductor substrate 10. The emitter electrode 52 and the collector electrode 24 are formed of a material containing metal or of a stacked film of those materials.

The semiconductor substrate 10 may be a silicon substrate, may be a silicon carbide substrate, or may be a nitride semiconductor substrate or the like of gallium nitride or the like. The semiconductor substrate 10 of the present example is the silicon substrate.

The semiconductor substrate 10 has a drift region 18 of a first conductivity type. The drift region 18 of the present example is of an N− type. The drift region 18 may be a remaining region in the semiconductor substrate 10 which is not provided with any other doping regions.

Above the drift region 18, one or more accumulation regions 16 may be provided in a Z axis direction. The accumulation region 16 is a region in which the same dopant as that of the drift region 18 is accumulated at a concentration higher than that of the drift region 18. The doping concentration of the accumulation region 16 is higher than the doping concentration of the drift region 18.

The accumulation region 16 of the present example is of an N type. The accumulation region 16 may be provided only in the transistor portion 70, or may be provided in both of the transistor portion 70 and the diode portion 80. The provision of the accumulation region 16 allows increasing a carrier injection enhancement effect (IE effect) to reduce an ON voltage.

In the transistor portion 70, above the base region 14, an emitter region 12 is provided in contact with the front surface 21. The emitter region 12 is provided in contact with the gate trench portion 40. The doping concentration of the emitter region 12 is higher than the doping concentration of the drift region 18. The dopant in the emitter region 12 is, as an example, arsenic (As), phosphorus (P), antimony (Sb), or the like.

In the diode portion 80, the base region 14 is provided to be exposed at the front surface 21. The base region 14 of the diode portion 80 operates as an anode.

Below the drift region 18, a buffer region 20 of the first conductivity type may be provided. The buffer region 20 of the present example is the N type. The doping concentration in the buffer region 20 is higher than the doping concentration in the drift region 18. The buffer region 20 may function as a field stop layer which prevents a depletion layer, which extends from a lower surface side of the base region 14, from reaching a collector region 22 and a cathode region 82.

In the transistor portion 70, below the buffer region 20, the collector region 22 is provided. The collector region 22 may be provided to be in contact with the cathode region 82 on the back surface 23.

In the diode portion 80, below the buffer region 20, the cathode region 82 is provided. The cathode region 82 may be provided at the same depth as the collector region 22 of the transistor portion 70. The diode portion 80 may function as a freewheeling diode (FWD) that causes a freewheeling current, which is conductive in an opposite direction, to flow when the transistor portion 70 turns off.

On the semiconductor substrate 10, the gate trench portion 40 and the dummy trench portion 30 are provided. The gate trench portion 40 and the dummy trench portion 30 are provided to pass through the base region 14 and the accumulation region 16 from the front surface 21, and reach the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

The gate trench portion 40 has a gate trench, a gate dielectric film 42, and a gate conductive portion 44 that are provided on the front surface 21. The gate dielectric film 42 is provided to cover an inner wall of the gate trench. The gate dielectric film 42 may be formed of an oxide film or a nitride film. The gate conductive portion 44 is provided to be embedded on an inner side further than the gate dielectric film 42 inside the gate trench. An upper surface of the gate conductive portion 44 may be in the same plane as the front surface 21. The gate dielectric film 42 insulates the gate conductive portion 44 from the semiconductor substrate 10. The gate conductive portion 44 is formed of polysilicon or the like doped with the impurity.

The gate conductive portion 44 may be provided to be longer than the base region 14 in a depth direction. The gate trench portion 40 is covered with the interlayer dielectric film 38 on the front surface 21. When a predetermined voltage is applied to the gate conductive portion 44, a channel is formed by an inversion layer with electrons on a surface layer in the base region 14 at an interface in contact with the gate trench.

The dummy trench portion 30 may have the same structure as the gate trench portion 40 in the cross section in the trench array direction. The dummy trench portion 30 has a dummy trench, a dummy dielectric film 32, and a dummy conductive portion 34 that are provided on the front surface 21. The dummy dielectric film 32 is provided to cover an inner wall of the dummy trench. The dummy dielectric film 32 may be formed of an oxide film or a nitride film. The dummy conductive portion 34 is provided to be embedded on an inner side further than the dummy dielectric film 32 inside the dummy trench. An upper surface of the dummy conductive portion 34 may be in the same XY plane as the front surface 21. The dummy dielectric film 32 insulates the dummy conductive portion 34 from the semiconductor substrate 10. The dummy conductive portion 34 may be formed of the same material as the gate conductive portion 44.

The gate trench portion 40 and the dummy trench portion 30 of the present example are covered with the interlayer dielectric film 38 on the front surface 21. It should be noted that bottom portions of the dummy trench portion 30 and the gate trench portion 40 may have curved surface shapes which are convex downward (curved line shapes in cross sections).

Between the respective trench portions in the trench array direction, a mesa portion is provided. The mesa portion indicates a region interposed between the trench portions inside the semiconductor substrate 10. As an example, a depth position of the mesa portion is from the front surface 21 of the semiconductor substrate 10 to a lower end of the trench portion.

The mesa portion of the present example is interposed between adjacent trench portions in the trench array direction, and is provided to extend in an extension direction (a Y axis direction) along the trench portion on the front surface 21 of the semiconductor substrate 10. In the present example, the transistor portion 70 is provided with a mesa portion 60, and the diode portion 80 is provided with a mesa portion 61. When the mesa portion is merely mentioned in the present specification, it indicates each of the mesa portion 60 and the mesa portion 61.

Each mesa portion is provided with the base region 14. Each mesa portion may be provided with at least one of the emitter region 12 of the first conductivity type, and a contact region (not shown) of a second conductivity type in a region interposed between the base regions 14 in a top plan view. In the present example, the emitter region 12 is of an N+ type, and the contact region is of a P+ type. The emitter region 12 and the contact region may be provided between the base region 14 and the front surface 21 of the semiconductor substrate 10 in the depth direction.

The mesa portion of the transistor portion 70 has the emitter region 12 exposed at the front surface 21 of the semiconductor substrate 10. The emitter region 12 is provided in contact with the gate trench portion 40. The mesa portion in contact with the gate trench portion 40 is provided with the contact region exposed at the front surface 21 of the semiconductor substrate 10.

Each of the contact region and the emitter region 12 in the mesa portion is provided from one trench portion up to the other trench portion in the trench array direction. As an example, the contact region and the emitter region 12 in the mesa portion are alternately arranged along a trench extension direction.

In another example, the contact region and the emitter region 12 in the mesa portion may be provided in a stripe shape along the trench extension direction. For example, the emitter region 12 is provided in a region in contact with the trench portion, and the contact region is provided in a region interposed between the emitter regions 12.

The mesa portion of the diode portion 80 is not provided with the emitter region 12. On an upper surface of the mesa portion of the diode portion 80, the base region 14 may be provided. The base region 14 may be arranged over the entire mesa portion of the diode portion 80.

Above each mesa portion, the contact hole 54 is provided. The contact hole 54 is arranged in a region interposed between the base regions 14 in the extension direction thereof. The contact hole 54 of the present example is provided above each region of the contact region, the base region 14, and the emitter region 12. The contact hole 54 may be arranged at the center of the mesa portion in the array direction.

In the diode portion 80, the cathode region 82 of the N+ type is provided in a region in direct contact with the back surface 23 of the semiconductor substrate 10. On the back surface 23 of the semiconductor substrate 10, the collector region 22 of the P+ type may be provided in a region where the cathode region 82 is not provided. In FIG. 1, a boundary between the cathode region 82 and the collector region 22 is indicated by a dotted line.

Figure 2:
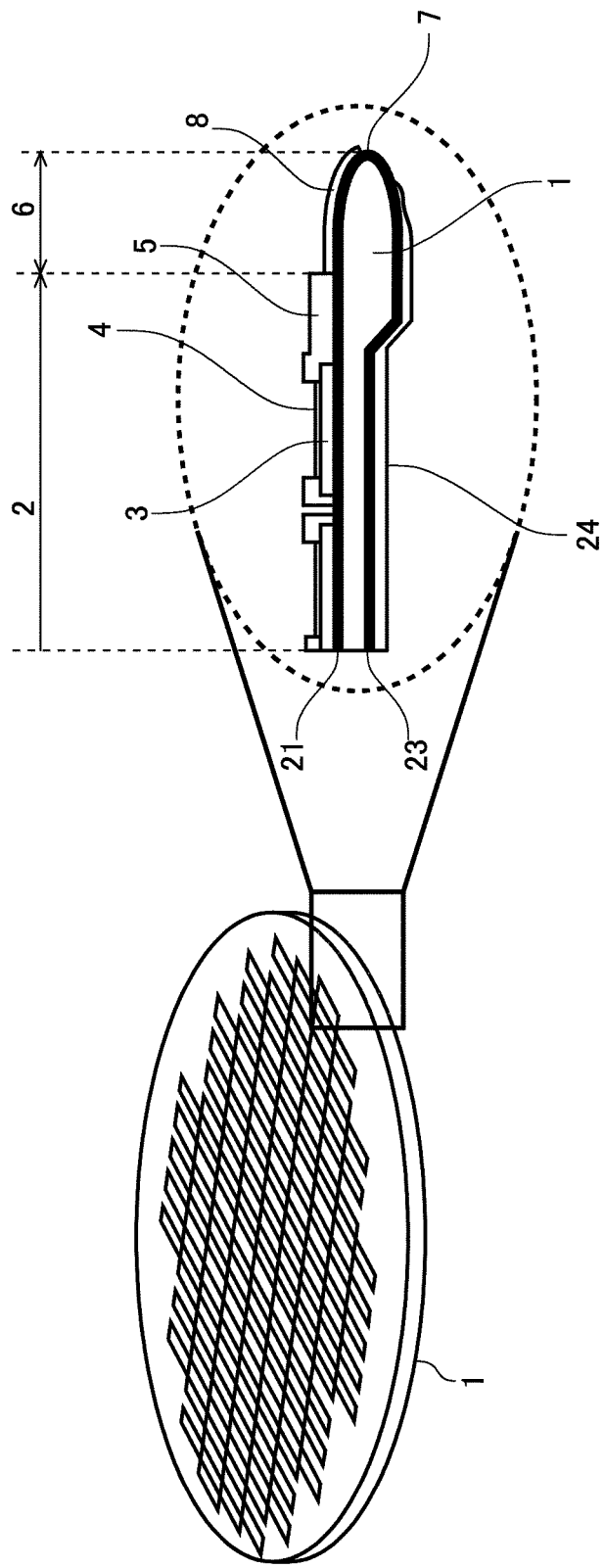
FIG. 2 is a schematic view showing an example of a wafer to which the manufacturing method for a semiconductor device according to an example is applied, and is a cross sectional view of an outer peripheral region 6 taken along a wafer radial direction.

FIG. 2 is a schematic view showing an example of a wafer to which the manufacturing method for a semiconductor device according to an example is applied, and is a cross sectional view of an outer peripheral region 6 taken along a wafer radial direction. A wafer 1 of the present example has a center region 2 in which an element structure is provided on the front surface 21, and the outer peripheral region 6 surrounding the center region 2. The element structure provided in the center region 2 constitutes the semiconductor device 100 described with reference to FIG. 1. Accordingly, the wafer 1 corresponds to the semiconductor substrate 10 of FIG. 1. For the wafer 1 of the present example, elements that are common to the semiconductor device 100 will be described with the same signs and numerals. Note that in FIG. 2, the structures such as the emitter region 12, the base region 14, and the gate trench portion 40 that are provided inside the semiconductor substrate 10 (the wafer 1) are omitted.

The center region 2 is provided with a first electrode layer 3 on the front surface 21, and a second electrode layer 4 formed on the first electrode layer 3 by plating. The first electrode layer 3 is formed of Al, Al—Si, Al—Si—Cu, Al—Cu, or the like. The first electrode layer 3 of the present example is Al—Si. The first electrode layer 3 has a thickness of 1.0 μm to 6.0 μm.

The second electrode layer 4 is formed of a solder bonding material, and causes the first electrode layer 3 to be bonded to an external connection terminal. The second electrode layer 4 of the present example is Ni/Au in which an Au layer is stacked on a Ni layer. The second electrode layer 4 may be formed by electroless plating processing. The first electrode layer 3 and the second electrode layer 4 constitute the emitter electrode 52 of the semiconductor device 100.

A passivation film 5 is provided on the front surface 21 of the wafer 1 and the first electrode layer 3 in the center region 2. The passivation film 5 only needs to be a dielectric film that adheres to the wafer 1 and the first electrode layer 3, and is formed of SiN, $SiO_2$, polyimide, or the like, in an example. The passivation film 5 of the present example is a polyimide film. The passivation film 5 has a thickness of 5 μm to 10 μm.

The passivation film 5 has an opening portion to expose the second electrode layer 4. In addition, the passivation film 5 provided above the element structure is separated from the passivation film 5 provided above the adjacent element structure. In the present example, an outermost periphery of the passivation film 5 is set as a boundary between the center region 2 and the outer peripheral region 6 in the top plan view of the wafer 1.

The outer peripheral region 6 is a region between the center region 2 and an end portion 7. The end portion 7 is a boundary between the front surface 21 and the back surface 23 of the wafer 1, and extends in a circular shape along an outer periphery of the wafer 1. In the outer peripheral region 6, an oxide film 8 is provided on the front surface 21 of the wafer 1. The oxide film 8 of the present example is formed by performing plasma processing on the wafer 1 to which an ion has been implanted. A heavy ion implanted to form the oxide film 8 in the present example is a heavy ion of an element in third and subsequent rows of a periodic table, and is an As ion, a P ion, or an Ar ion, in an example. The thickness of the oxide film 8 of the present example is 8 nm or more and 50 nm or less.

On the back surface 23 of the wafer 1, the collector electrode 24 is provided. The collector electrode 24 of the present example has a stack structure of Al/Ti/Ni/Au in order from a back surface 23 side. Alternatively, the collector electrode 24 may have, in order from the back surface 23 side, a stack structure such as Al—Si/Ti/Ni/Au, Ti/Ni/Au, Al/Ti/Ni/Ag, Al—Si/Ti/Ni/Ag, Al/Ti/NiV/Au, Al—Si/Ti-NiV/Au, Al/TiNiV/Ag, Al—Si/TiNiV/Ag, and Ti/NiV/Ag. In the present example, the collector electrode 24 is provided over substantially the entire surface of the back surface 23, but may be provided only in a region corresponding to the element structure, that is, the center region 2.

FIG. 3A to FIG. 3J are cross sectional views showing examples of the wafer in each step of the manufacturing method for a semiconductor device according to an example. Similar to FIG. 2, FIG. 3A to FIG. 3J show cross sectional views of the outer peripheral region 6 taken along the wafer radial direction. Here, a step of forming the oxide film 8 on the outer peripheral region 6, and a step of forming the second electrode layer 4 on the first electrode layer 3 of the center region 2 by plating, on the front surface 21 of the wafer 1, will be mainly described.

Figure 3A:
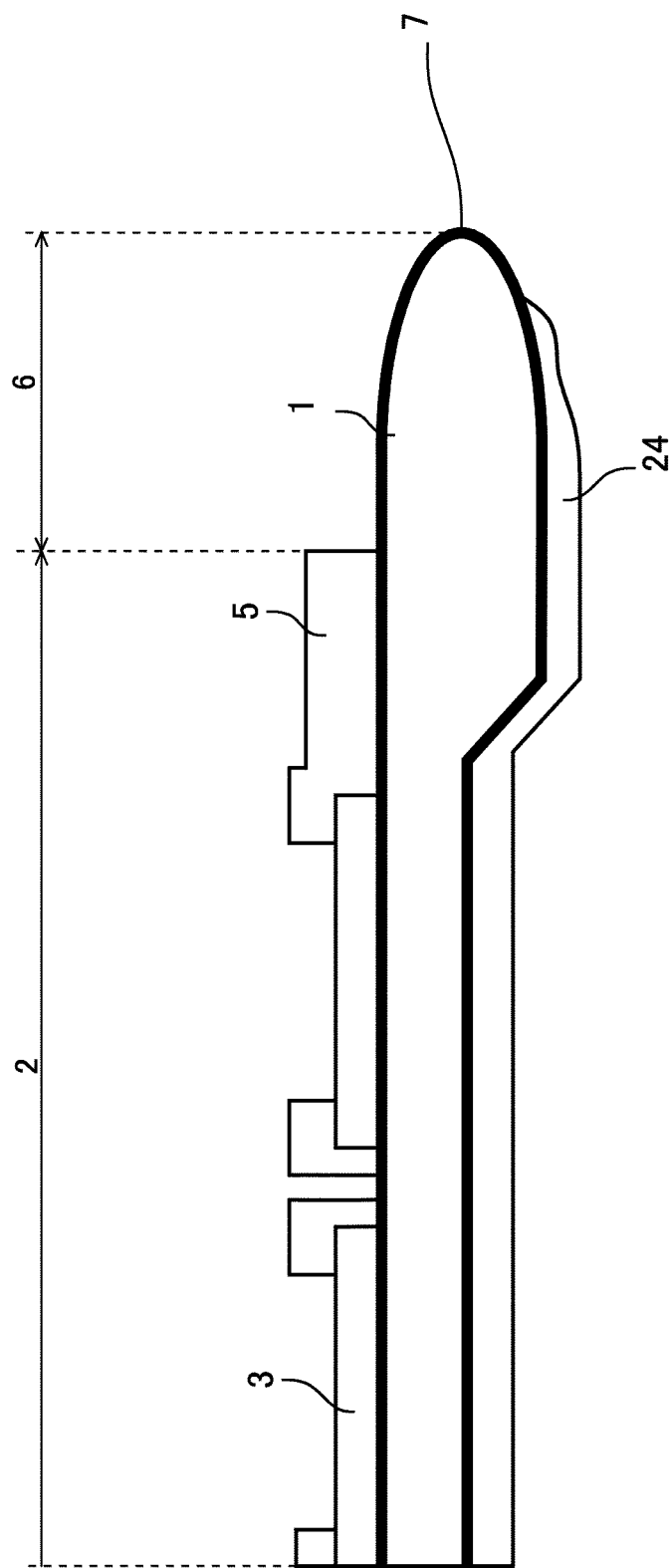
FIG. 3A is a cross sectional view showing an example of the wafer in each step of the manufacturing method for a semiconductor device according to an example.

FIG. 3A shows the wafer 1 that has undergone a step of forming the first electrode layer 3 on the front surface 21 of the wafer 1, and a step of forming the passivation film 5 on the first electrode layer 3. The first electrode layer 3 is formed by forming, by Al—Si, a film having a thickness of 1.0 μm to 6.0 μm.

In an example, the step of forming the passivation film 5 includes a step of applying polyimide to the front surface 21 of the wafer 1, a step of removing the polyimide wrapping around the outer peripheral region 6 and the back surface 23 by edge rinsing processing, and a step of curing the polyimide applied to the center region 2. The edge rinsing processing may be performed along the end portion 7 in a range of a width of 2.5 mm. The passivation film 5 may be formed up to a range on an outer side further the element structure in the top plan view of the wafer 1 to a degree that the applied polyimide does not wrap around the back surface 23.

Here, the passivation film 5 is not formed in the outer peripheral region 6, and thus silicon of the wafer 1 is exposed at the front surface 21 of the wafer 1. It should be noted that a step of forming the collector electrode 24 on the back surface 23 of the wafer 1 may be performed before or after the steps of forming the first electrode layer 3 and the passivation film 5.

Figure 3B:
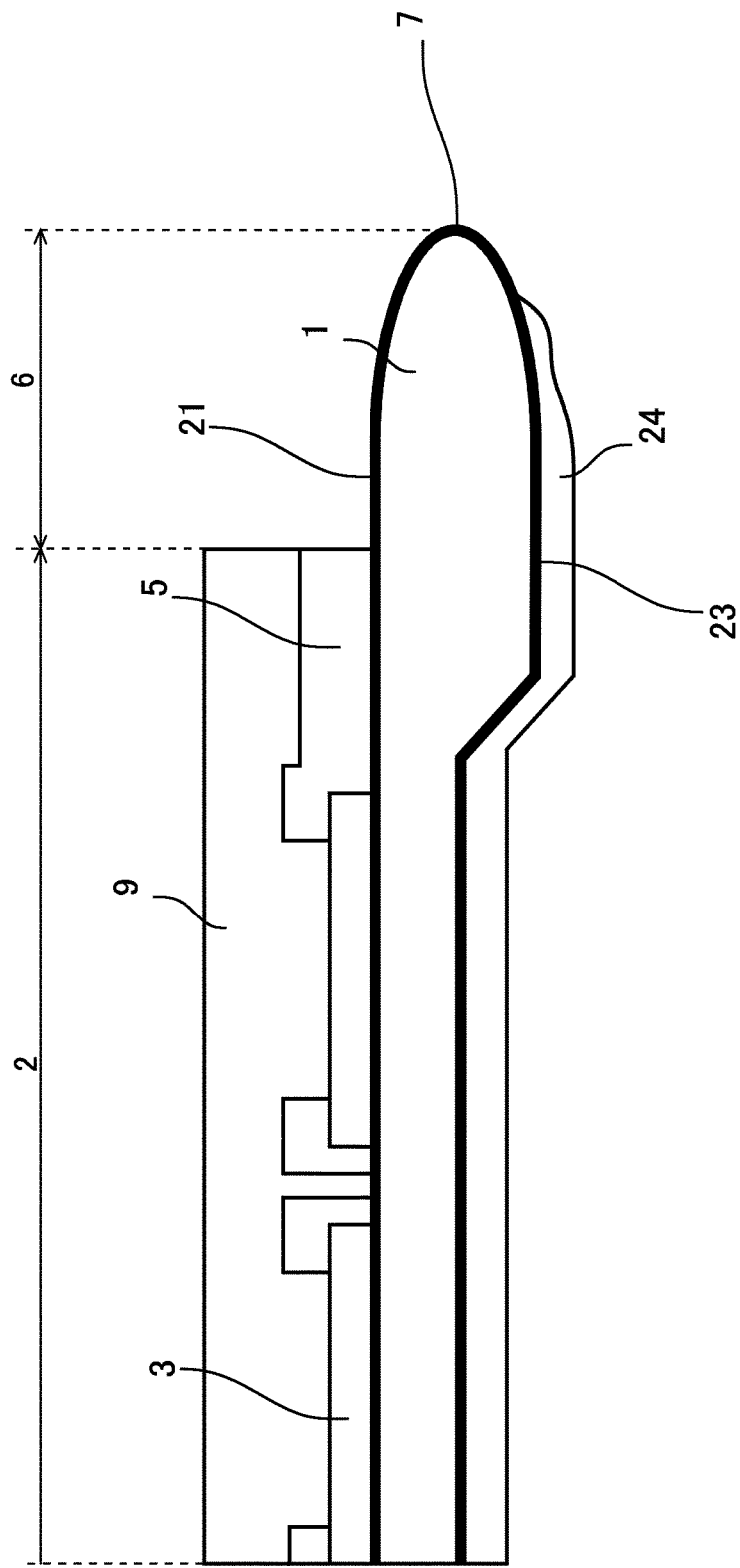
FIG. 3B is a cross sectional view showing an example of the wafer in each step of the manufacturing method for a semiconductor device according to an example.

FIG. 3B shows the wafer 1 that has undergone a step of forming a resist 9 on the first electrode layer 3. In an example, the resist 9 is formed by depositing a resist on the front surface 21 of the wafer 1 and performing spin coating, and then dissolving and removing the resist by the edge rinsing processing by an organic solvent in a region for the resist 9 not to be provided. Alternatively, the resist 9 may be formed by exposing or not exposing a photosensitive resist with which the front surface 21 of the wafer 1 is spin-coated, and then removing the resist by a developing solution in the region for the resist 9 not to be provided.

The resist 9 of the present example may be formed in the entire center region 2 in the top plan view of the wafer 1, that is, in the same range as the passivation film 5, or may be formed in a range on an inner side further than the outer periphery of the passivation film 5. That is, the resist 9 is not formed in the outer peripheral region 6. This is because in a case where the resist 9 is formed in the outer peripheral region 6 on the front surface 21 of the wafer 1, the formation of the oxide film 8 is hindered in that region in an oxide film formation step which will be described below.

The resist 9 of the present example has a thickness of 5 times or more a depth of an implantation range of an ion into the resist 9 in an ion implantation step which will be described below. In an example, the thickness of the resist 9 is 2 μm or more. This prevents the implanted ion from penetrating the resist 9 in the ion implantation step which will be described below.

Figure 3C:
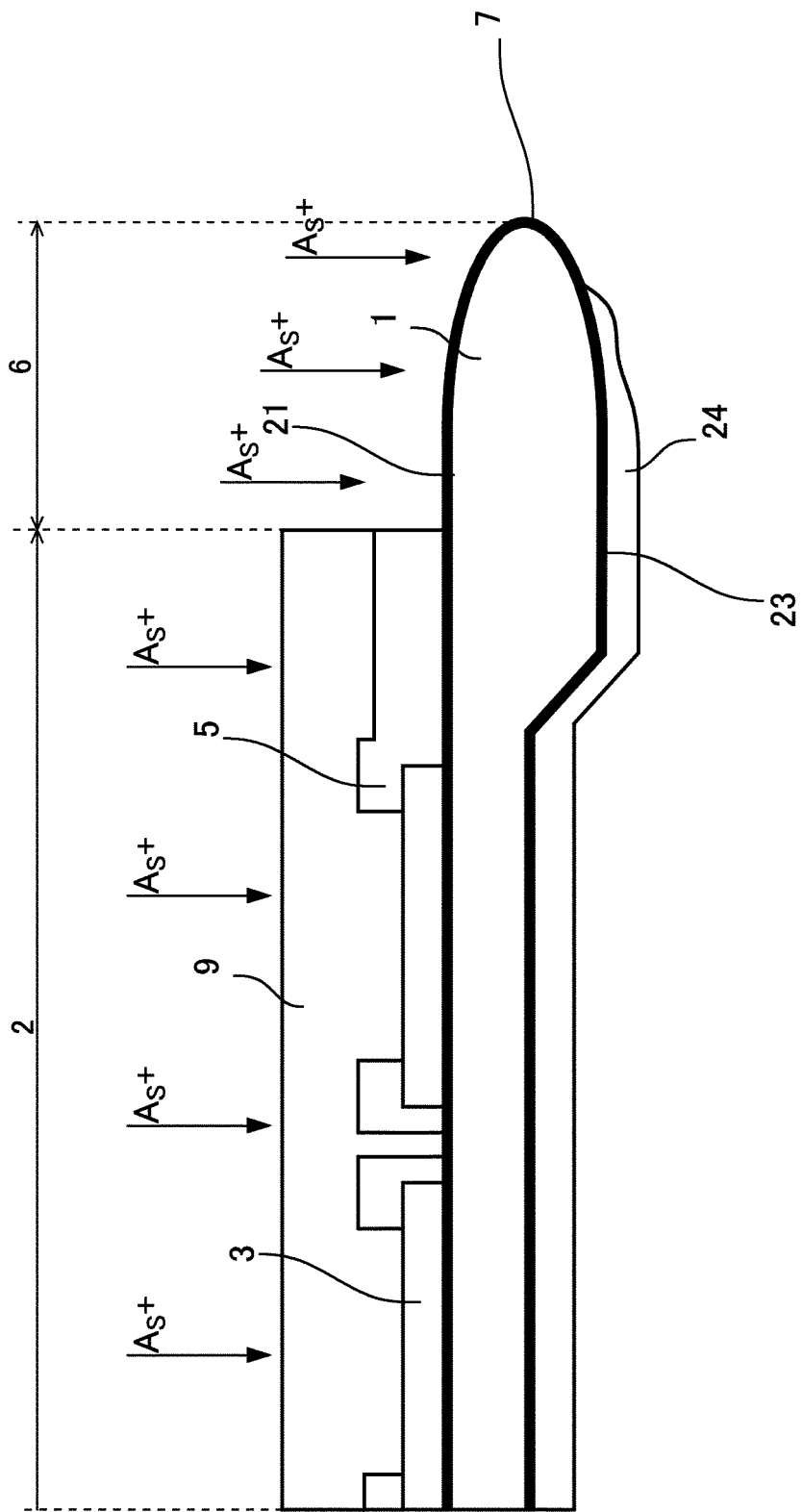
FIG. 3C is a cross sectional view showing an example of the wafer in each step of the manufacturing method for a semiconductor device according to an example.

FIG. 3C shows a wafer 1 that has undergone a step of implanting, into the outer peripheral region 6, the heavy ion of an element in the third and subsequent rows of the periodic table. In an example, the heavy ion is an As ion, a P ion, or an Ar ion. In the present example, the As ion is implanted. The As ion may be implanted into the entire surface of the front surface 21 of the wafer 1, or may be implanted only into the outer peripheral region 6. By implanting the ionized impurity element, a crystal defect is formed in the silicon of the wafer 1 which is exposed in the outer peripheral region 6; however, by implanting the heavy ion with a large mass, the oxide film 8 with a uniform film thickness is formed in the oxide film formation step which will be described below.

In the present example, a dose of the heavy ion is $1E15$ cm$^{-2}$ or more. This causes the crystal defect to be reliably formed even at the end portion 7 where it is difficult to implant the ion. The depth of the implantation range of the heavy ion into the wafer 1 may be 0.02 μm or more, and acceleration energy may be 20 keV to 30 keV. Thereby, the implanted ion does not penetrate the resist 9 in the center region 2, and the crystal defect is formed in the silicon of the wafer 1 in the outer peripheral region 6.

Figure 3D:
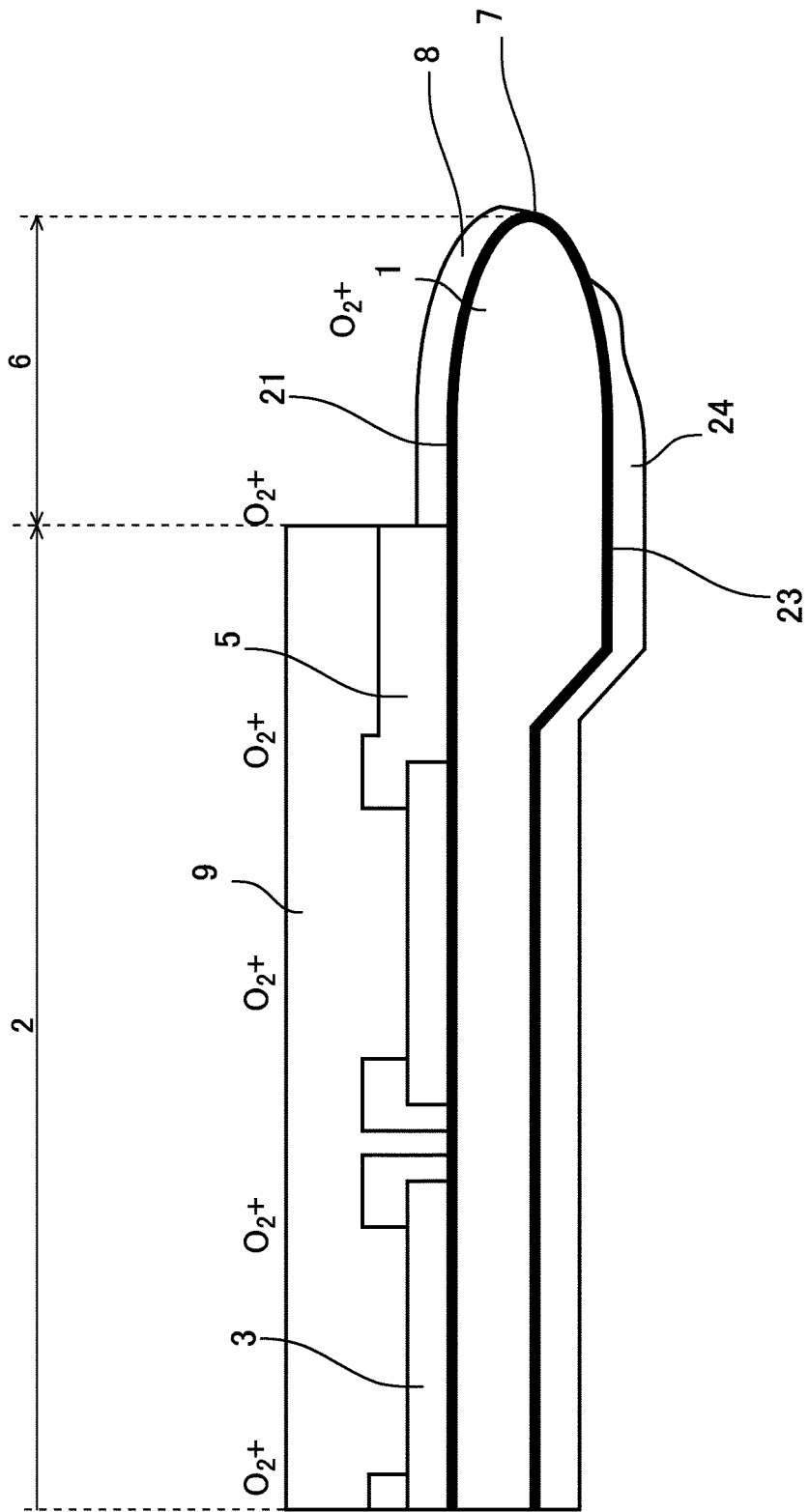
FIG. 3D is a cross sectional view showing an example of the wafer in each step of the manufacturing method for a semiconductor device according to an example.
Figure 3E:
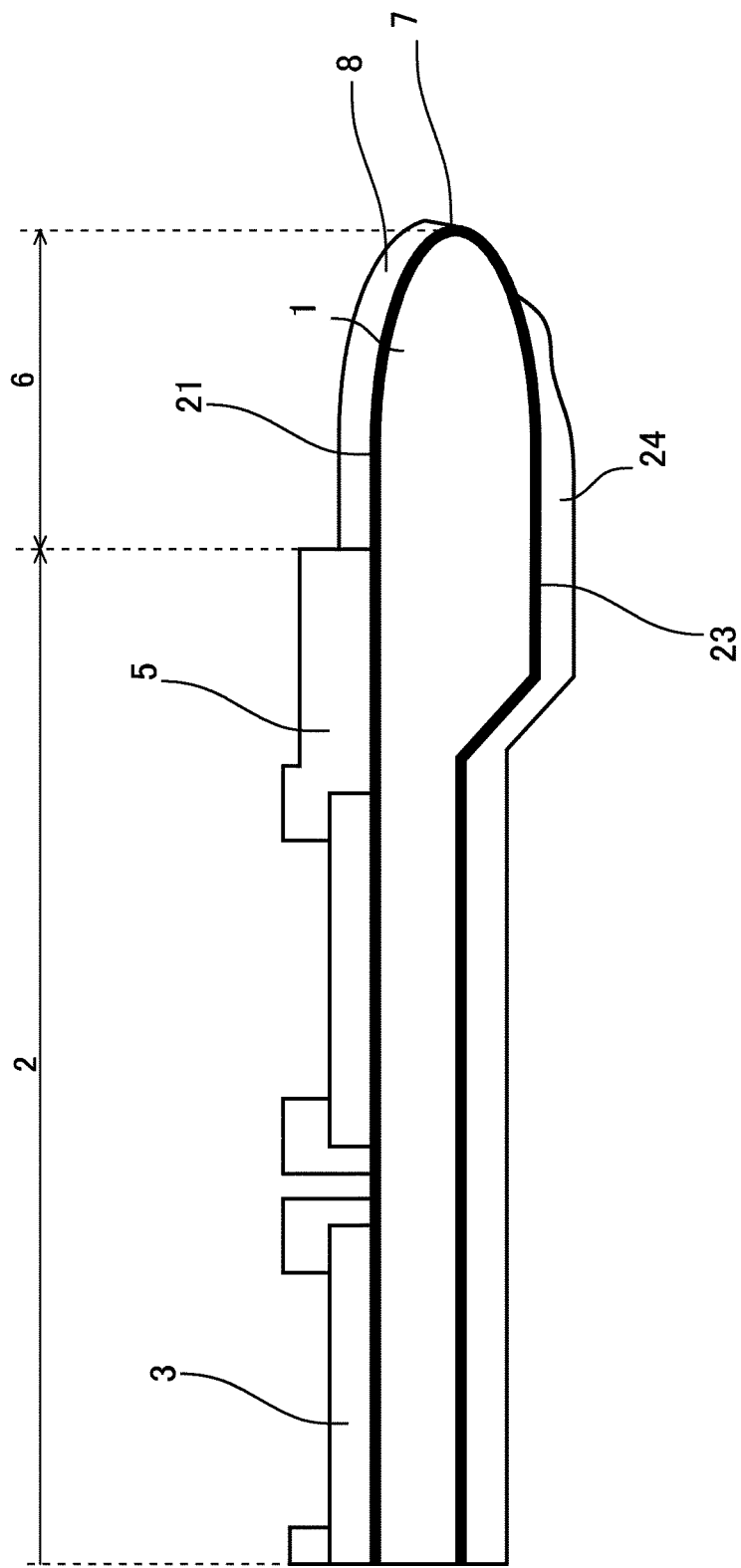
FIG. 3E is a cross sectional view showing an example of the wafer in each step of the manufacturing method for a semiconductor device according to an example.

FIG. 3D and FIG. 3E show the wafer 1 on which a plasma processing step is performed on the front surface 21. In the present example, by irradiating the front surface 21 of the wafer 1 with an $O_2$ radical, the outer peripheral region 6 where the heavy ion has been implanted is selectively plasma-oxidized, and the oxide film 8 grows, as shown in FIG. 3D. The thickness of the oxide film 8 of the present example is 8 nm or more and 50 nm or less.

On the other hand, by irradiating the front surface 21 of the wafer 1 with the $O_2$ radical, the resist 9 is ashed (ashing-processed) and annihilated in the center region 2, as shown in FIG. 3E. That is, the step of forming the oxide film 8 by the plasma processing of the present example serves as ashing of the resist 9.

An upper surface of the first electrode layer 3 exposed by removing the resist 9 may be descumming-processed by the irradiation with the plasma. It should be noted that the descumming processing refers to processing for removing a residue such as carbon before a plating growth step which will be described below. That is, the step of forming the oxide film 8 by the plasma processing of the present example may further serve as the descumming processing of the first electrode layer 3.

Figure 3F:
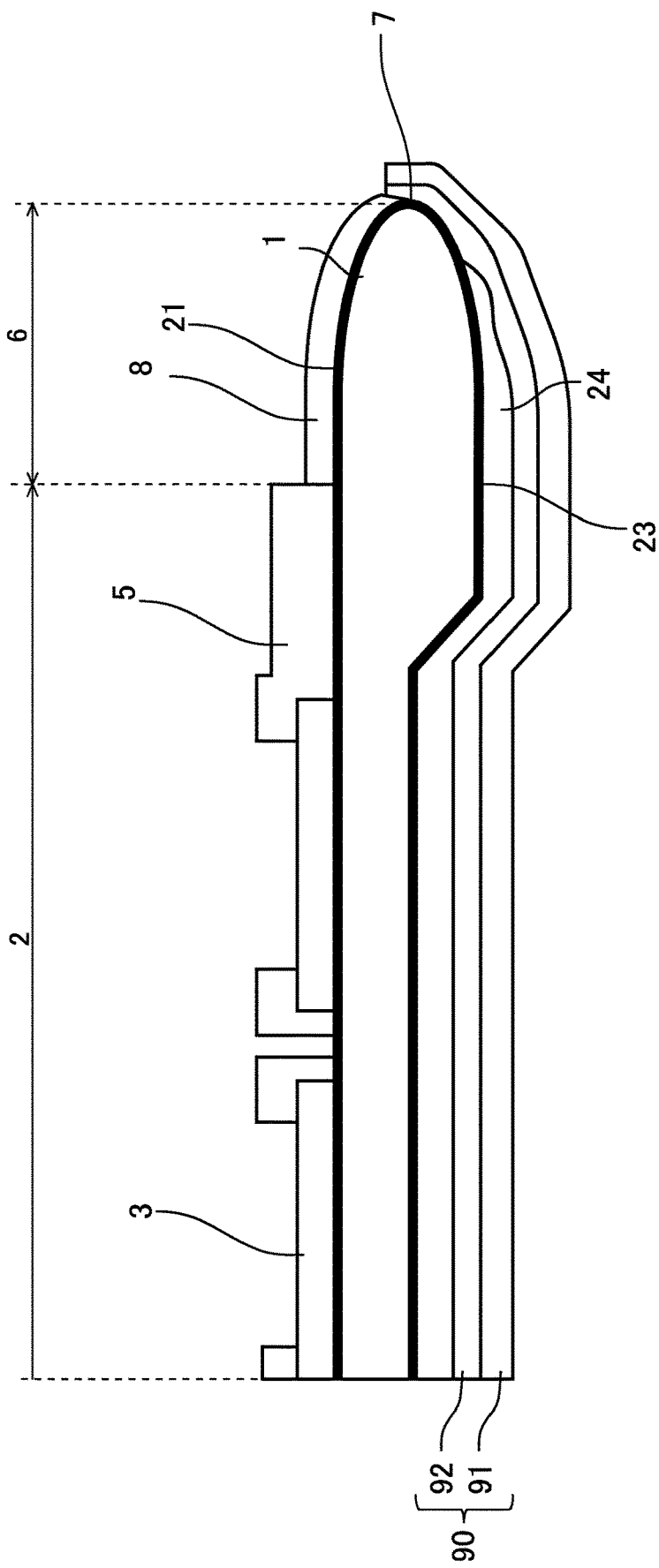
FIG. 3F is a cross sectional view showing an example of the wafer in each step of the manufacturing method for a semiconductor device according to an example.

FIG. 3F shows the wafer 1 that has undergone a step of attaching a protective tape 90 to the back surface 23 of the wafer 1. The protective tape 90 protects the collector electrode 24, which is provided on the back surface 23 of the wafer 1, from a plating solution in the plating growth step which will be described below. In an example, the protective tape 90 has a structure in which a base material 91 and an adhesive 92 are stacked. A diameter of the protective tape 90 is larger than a diameter of the wafer 1. The protective tape 90 may cover the entire surface of the back surface 23 of the wafer 1. In the present example, in a state where the outer peripheral region 6 of the front surface 21 is exposed without being covered with the protective tape 90, the subsequent plating growth step is performed on the outer peripheral region 6.

Figure 3G:
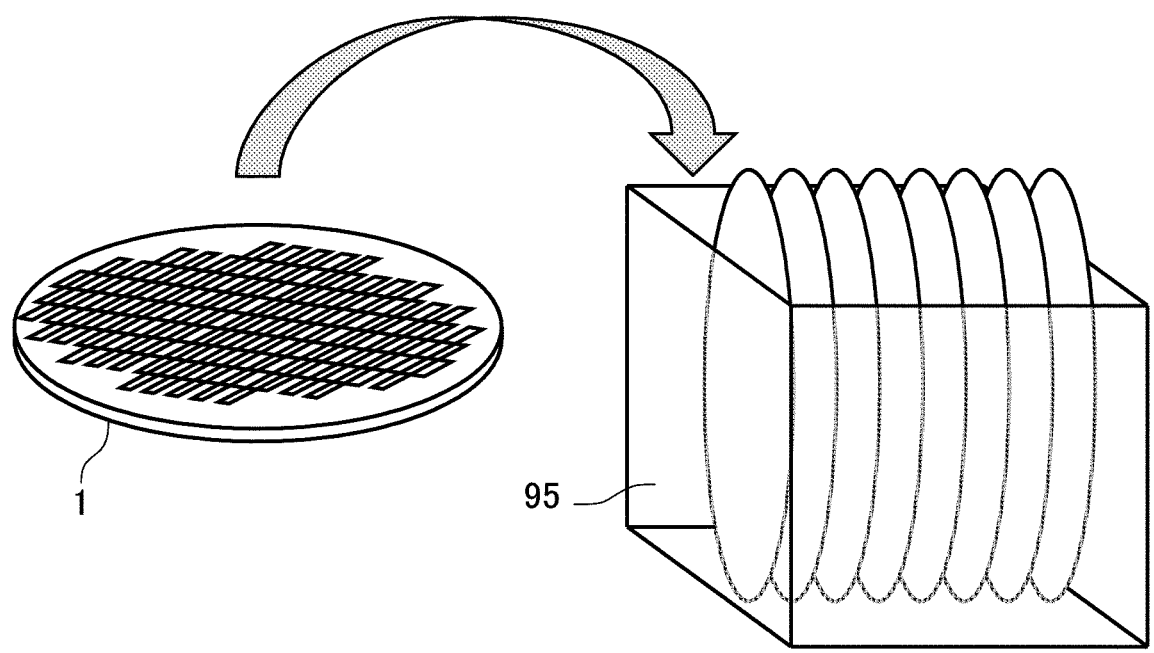
FIG. 3G is a cross sectional view showing an example of the wafer in each step of the manufacturing method for a semiconductor device according to an example.
Figure 3H:
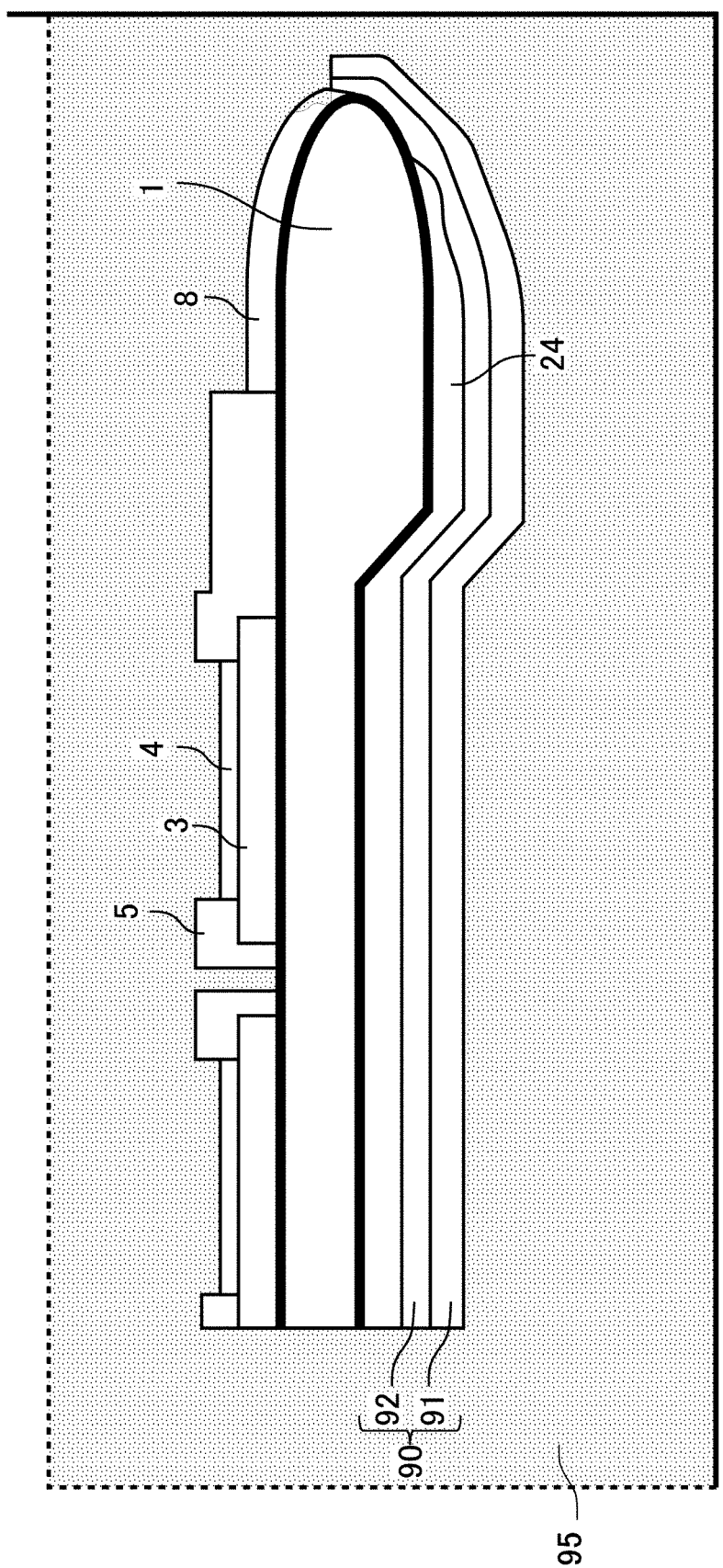
FIG. 3H is a cross sectional view showing an example of the wafer in each step of the manufacturing method for a semiconductor device according to an example.

FIG. 3G to FIG. 3H show the wafer 1 on which the plating growth step is performed. The wafer 1 in which the protective tape 90 is attached to the back surface 23 is immersed in a plating solution 95. It should be noted that in the actual plating growth step, the wafer 1 is immersed in a plurality of plating tanks for pre-processing and post-processing; however, only one plating tank is shown for simplification in FIG. 3G to FIG. 3H.

On the first electrode layer 3, a Ni film is formed by the electroless plating processing. After that, the wafer 1 is immersed in a post-processing tank, and then an Au film for preventing oxidation of the Ni film is caused to grow by the immersion. Thereby, as shown in FIG. 3H, the second electrode layer 4 of Ni/Au is formed. It should be noted that the plating growth step, the protective tape attaching step performed before the plating growth step, and a protective tape peeling step which is performed after the plating growth step and which will be described below, may be collectively referred to as plating processing.

In the plating growth step, a small amount of plated metal is formed on a conductive material by a reduction reaction of the plating solution 95. Therefore, when the silicon of the wafer is exposed, a plated metal is formed on the portion. Such unintentionally generated plated metal has low adhesion to the substrate, and thus may peel off and remain in the plating solution 95 to cause plating undergrowth locally, or cause the device to malfunction by reattaching to the wafer.

In the wafer 1 of the present example, the oxide film 8 is provided on the front surface 21 in the outer peripheral region 6, and thus the silicon of the wafer 1 is not exposed in the outer peripheral region 6, in which the passivation film 5 is not provided, as well. In this way, it is possible to prevent the formation of the unintended plated metal in the outer peripheral region 6.

Figure 3I:
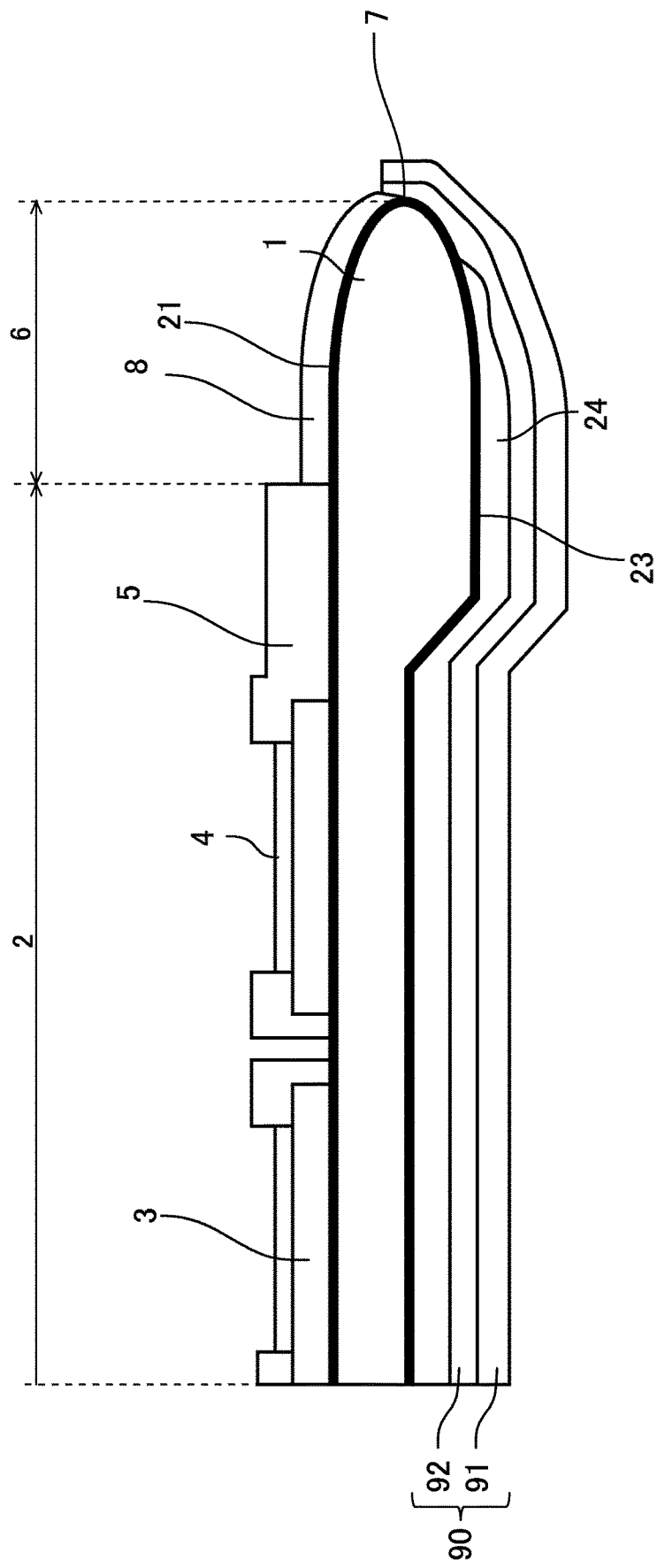
FIG. 3I is a cross sectional view showing an example of the wafer in each step of the manufacturing method for a semiconductor device according to an example.

FIG. 3I shows the wafer 1 taken out from the plating solution 95, and FIG. 3J shows the wafer 1 that has undergone the peeling step of the protective tape 90. The adhesive 92 of the protective tape 90 has a greater adhesive force to the base material 91 than to metal and oxide. Therefore, when the protective tape 90 covering the collector electrode 24 is peeled off, the adhesive 92 is peeled off from the collector electrode 24 while still adhering to the base material 91.

However, the adhesive 92 of the protective tape 90 has a greater adhesive force to silicon than to the base material 91. Therefore, in a case where the protective tape 90 is attached to the region where the silicon of the wafer is exposed, when the protective tape 90 is peeled off, the adhesive 92 is peeled off from the base material 91 and remains to adhere to the silicon, which leads to generating a so-called adhesive residue. Due to the adhesive residue, there is a possibility that the wafer is attached to a stage, a conveyance arm, or the like in a step subsequent to the plating processing.

In the wafer 1 of the present example, the oxide film 8 is provided on the outer peripheral region 6 of the front surface 21, and thus it is not necessary to cover the outer peripheral region 6 with the protective tape 90 for protection from the plating solution 95. Alternatively, the outer peripheral region 6 of the front surface 21 may be covered with the protective tape 90 for the plating growth step to be performed on the wafer 1. Even when the protective tape 90 is attached to the outer peripheral region 6 of the front surface 21, since the oxide film 8 is provided on the outer peripheral region 6, and the adhesive force of adhesive 92 to the oxide film 8 is small, there is no possibility that the adhesive residue is generated after the protective tape 90 is peeled off.

Figure 4A:
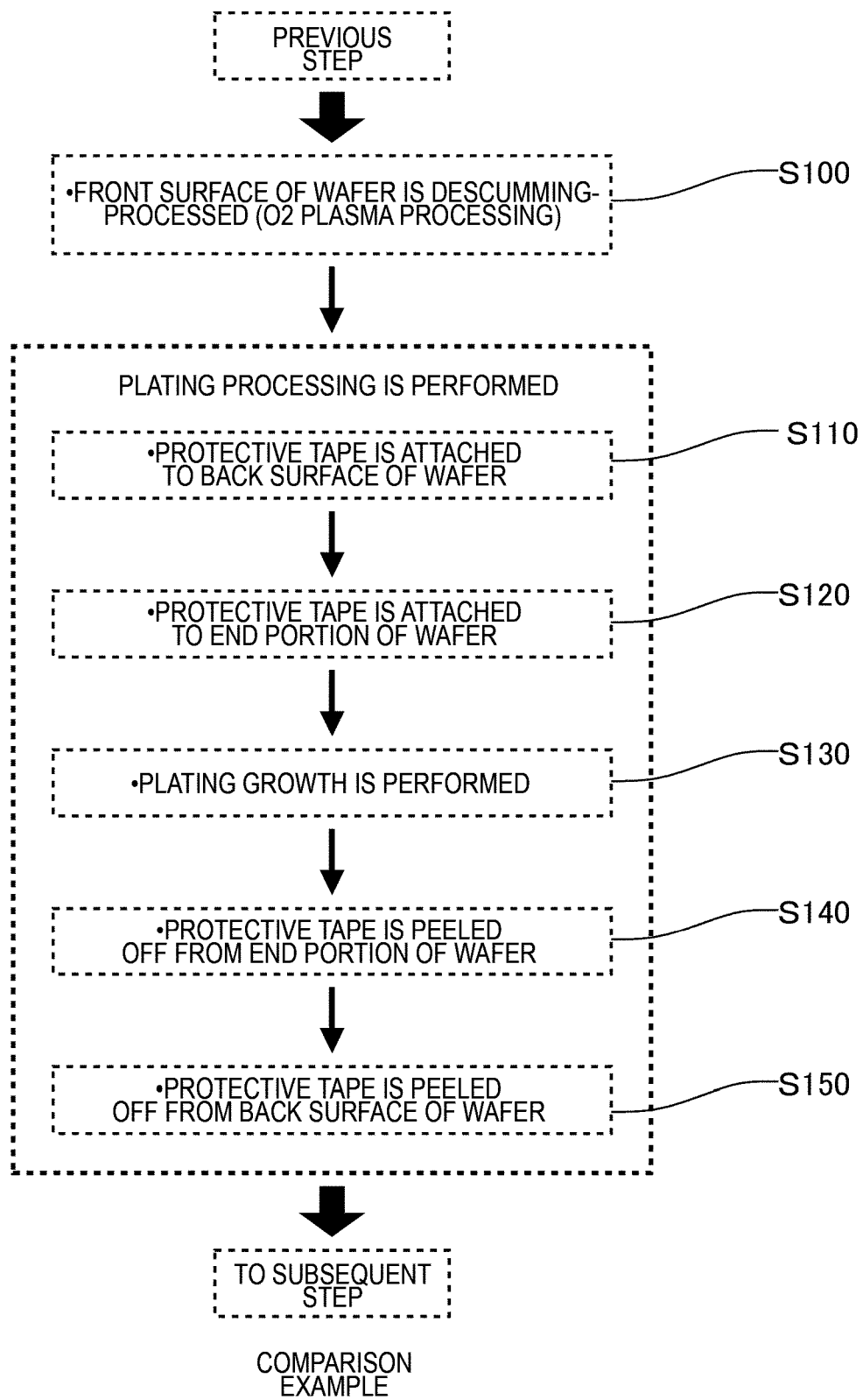
FIG. 4A is a flowchart showing an example of a manufacturing method for a semiconductor device according to a comparison example.

FIG. 4A is a flowchart showing an example of a manufacturing method for a semiconductor device according to a comparison example. Here, the plating processing for forming the second electrode layer 4 on the first electrode layer 3 will be mainly described. A wafer which is used in the comparison example is different from the wafer 1 according to the example in that the oxide film 8 is not provided. Note that the wafer which is used in the comparison example has the same structure as the wafer 1 according to the example in other respects, and thus the elements that are common to the wafer 1 will be described to be the same elements with the same signs and numerals. In step S100, the front surface 21 of the wafer that has undergone the previous step is descumming-processed by being irradiated with $O_2$ plasma.

In step S110, the protective tape 90 is attached to the back surface 23 of the wafer, and in step S120, the protective tape 90 is further attached to the end portion 7 of the wafer. The protective tape 90 attached to the end portion 7 covers the outer peripheral region 6 of the front surface 21 and the back surface 23 with the end portion 7 of the wafer as the center. That is, by covering the silicon of the wafer exposed in the outer peripheral region 6 of the front surface 21, the protective tape 90 attached to the end portion 7 protects the outer peripheral region 6 from the plating solution 95 in the subsequent plating growth step. It should be noted that order of step S110 and step S120 may be reversed, and the protective tape 90 covering the end portion 7 may be superimposed on the protective tape 90 covering the back surface 23, or vice versa.

In step S130, the wafer is immersed in the plating solution 95 and the plating growth step is performed. In step S140, the protective tape 90 is peeled off from the end portion 7 of the wafer, and in step S150, the protective tape 90 is peeled off from the back surface 23 of the wafer. The outer peripheral region 6 and the back surface 23 of the wafer are protected by the protective tape 90 during the plating growth step, and thus Ni plating does not grow in these regions, and the second electrode layer 4 is formed only on the first electrode layer 3. The wafer that has undergone the plating processing undergoes a subsequent step, and the semiconductor device 100 is finally formed.

Figure 4B:
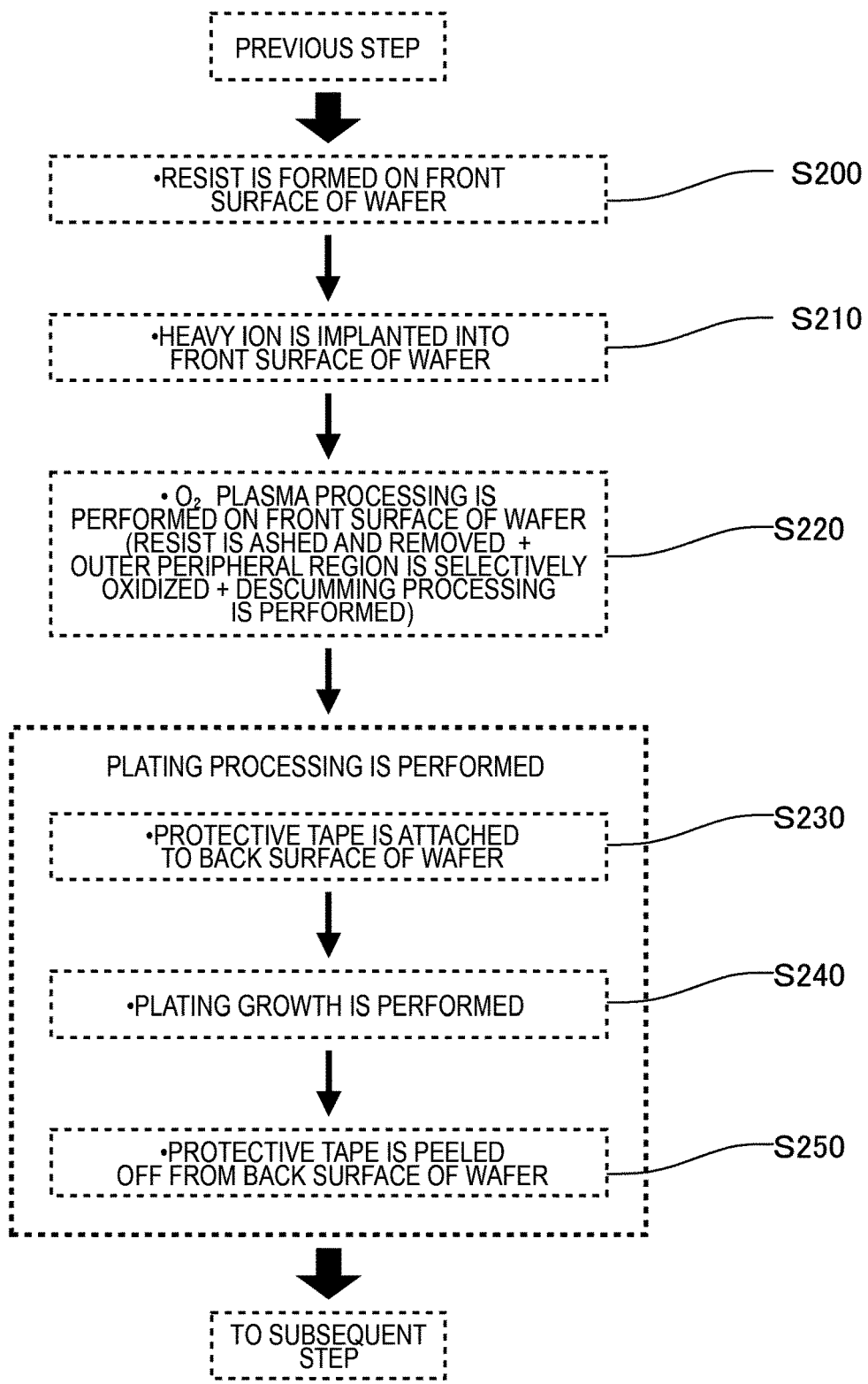
FIG. 4B is a flowchart showing an example of the manufacturing method for a semiconductor device according to an example.

FIG. 4B is a flowchart showing an example of the manufacturing method for a semiconductor device according to an example. Similar to the comparison example described with reference to FIG. 4A, a difference from the comparison example will be mainly described in relation to the plating processing. In step S200, the resist 9 is formed on the front surface 21 of the wafer 1 that has undergone the previous step. The resist 9 is formed on the first electrode layer 3 provided in the center region 2 of the front surface 21.

In step S210, the heavy ion of the element in the third and subsequent rows of the periodic table is implanted into the outer peripheral region 6 of the front surface 21 of the wafer 1. In an example, the heavy ion is an As ion, a P ion, or an Ar ion, and in the present example, the As ion is implanted. The dose of the heavy ion is 1E15 cm$^{-2}$ or more. The depth of the implantation range of the heavy ion into the wafer 1 may be 0.02 μm or more, and acceleration energy may be 20 keV to 30 keV.

In step S220, the plasma processing step is performed on the front surface 21 of the wafer 1. In the present example, by irradiating the front surface 21 of the wafer 1 with an $O_2$ radical, the outer peripheral region 6 where the heavy ion has been implanted is selectively oxidized, and the oxide film 8 grows, and the resist 9 provided in the center region 2 is ashed and removed, and the descumming processing on the first electrode layer 3 is performed. The thickness of the oxide film 8 formed here is 8 nm or more and 50 nm or less.

That is, in the comparison example, the plasma processing step is performed only for the descumming processing before the plating processing (step S100); however, in the example, in the plasma processing step, not only the descumming processing but also the growth step of the oxide film 8 and the ashing and removing steps of the resist 9 can be performed at the same time. In this way, with the example, the step can be made efficient.

In step S230, the protective tape 90 is attached to the back surface 23 of the wafer. In step S240, the wafer 1 is immersed in the plating solution 95, and the plating growth step is performed. In step S250, the protective tape 90 is peeled off from the back surface 23 of the wafer. The wafer that has undergone the plating processing undergoes a subsequent step, and the semiconductor device 100 is finally formed.

Unlike the comparison example, the example does not include the step of attaching the protective tape 90 to the end portion 7 before the plating growth step. That is, in the example, the plating growth step is performed on the wafer 1 in a state in which the outer peripheral region 6 of the front surface 21 is exposed. In the example, the oxide film 8 is provided on the outer peripheral region 6 of the front surface 21 of the wafer 1, and thus the protection with the protective tape 90 is not necessary during the plating growth step as well, and it is possible to omit the step of attaching the protective tape 90 to the end portion 7 (step S120) and the peeling step (step S140) in the comparison example.

Alternatively, in the example, the step of attaching the protective tape 90 to the end portion 7 (step S120) and the peeling step (step S140) may be performed. In this case, the protective tape 90 covers the oxide film 8 in the outer peripheral region 6 of the front surface 21 of the wafer 1. That is, in the outer peripheral region 6 of the front surface 21 of the wafer 1, in the comparison example, the adhesive 92 of the protective tape 90 adheres to the silicon of the wafer, whereas in the example, the adhesive 92 of the protective tape 90 adheres to the oxide film 8.

The adhesive 92 of the protective tape 90 has a greater adhesive force to silicon than to the base material 91. Therefore, in the comparison example, when the protective tape 90 is peeled off (step S140), there is a possibility that the adhesive 92 is peeled off from the base material 91 and remains to adhere to the silicon, which leads to generating the adhesive residue. In contrast with this, the adhesive 92 of the protective tape 90 has a greater adhesive force to the base material 91 than to metal and oxide. Accordingly, in the example, when the protective tape 90 covering the oxide film 8 is peeled off, the adhesive 92 is peeled off from the oxide film 8 while still adhering to the base material 91, and thus the adhesive residue is not generated. In this way, with the example, there is no possibility that the wafer is attached to a stage, a conveyance arm, or the like due to the adhesive residue, in a step subsequent to the plating processing.

Figure 5:
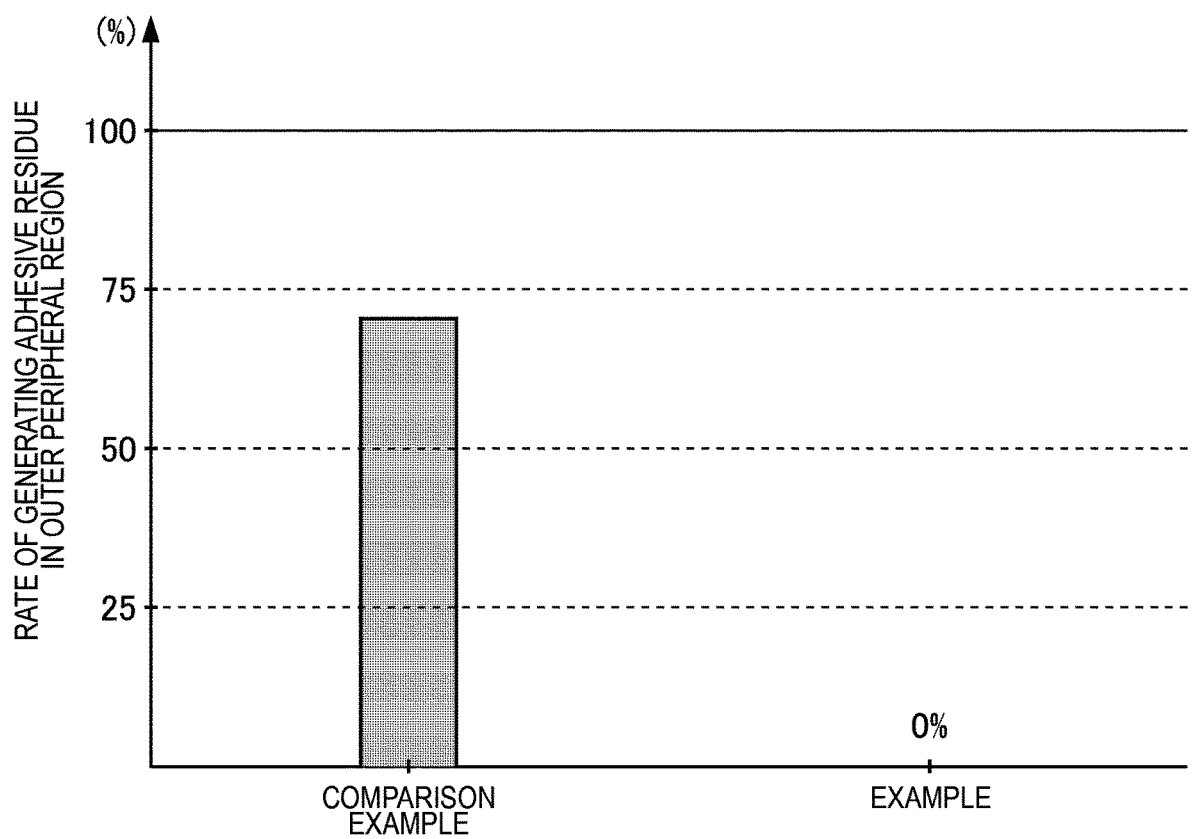
FIG. 5 is a diagram comparing a rate of generating adhesive residue in the outer peripheral region of the wafer.

FIG. 5 is a diagram comparing a rate of generating adhesive residue in the outer peripheral region of the wafer. Here, rates of generating the adhesive residue in the outer peripheral region 6 of the front surface 21 are compared between the wafer on which the plating processing according to the comparison example shown in FIG. 4A has been performed, and the wafer 1 on which the plating processing according to the example shown in FIG. 4B (including a case where the step of attaching the protective tape to the end portion 7 and the peeling step are performed, and a case where both of the steps are not performed) has been performed. The rate of generating the adhesive residue is a percentage of the number of wafers, in which the adhesive residue is checked after the plating processing, to a total number of wafers processed in the same step.

In the comparison example, the rate of generating the adhesive residue exceeded 70%, whereas in the example, the rate of generating the adhesive residue was 0%. In this way, with the example, the adhesive residue is prevented from being generated, and thus there is no possibility that the wafer is attached to a stage, a conveyance arm, or the like, in a step subsequent to the plating processing.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: wafer, 2: center region, 3: first electrode layer, 4: second electrode layer, 5: passivation film, 6: outer peripheral region, 7: end portion, 8: oxide film, 9: resist, 10: semiconductor substrate, 12: emitter region, 14: base region, 16: accumulation region, 18: drift region, 20: buffer region, 21: front surface, 22: collector region, 23: back surface, 24: collector electrode, 30: dummy trench portion, 32: dummy dielectric film, 34: dummy conductive portion, 38: interlayer dielectric film, 40: gate trench portion, 42: gate dielectric film, 44: gate conductive portion, 52: emitter electrode, 54: contact hole, 60: mesa portion, 61: mesa portion, 70: transistor portion, 80: diode portion, 82: cathode region, 90: protective tape, 91: base material, 92: adhesive, 95: plating solution, 100: semiconductor device

What is claimed is:

1. A manufacturing method for a semiconductor device comprising:
   forming a first electrode layer on a front surface of a wafer;
   implanting, into an outer peripheral region of the front surface of the wafer, a heavy ion of an element to cause a crystal defect in silicon of the wafer;
   forming an oxide film in the outer peripheral region into which the heavy ion has been implanted; and
   forming a second electrode layer on the first electrode layer by plating.

2. The manufacturing method for a semiconductor device according to claim 1, wherein
   a dose of the heavy ion is 1E15 $cm^{-2}$ or more.

3. The manufacturing method for a semiconductor device according to claim 1, wherein
   a depth of an implantation range of the heavy ion into the wafer is 0.02 μm or more.

4. The manufacturing method for a semiconductor device according to claim 2, wherein
   a depth of an implantation range of the heavy ion into the wafer is 0.02 μm or more.

5. The manufacturing method for a semiconductor device according to claim 1, wherein
   the heavy ion is an As ion, a P ion, or an Ar ion.

6. The manufacturing method for a semiconductor device according to claim 2, wherein
   the heavy ion is an As ion, a Pi on, or an Ar ion.

7. The manufacturing method for a semiconductor device according to claim 1, wherein
   a thickness of the oxide film is 8 nm or more and 50 nm or less.

8. The manufacturing method for a semiconductor device according to claim 2, wherein
   a thickness of the oxide film is 8 nm or more and 50 nm or less.

9. The manufacturing method for a semiconductor device according to claim 1, wherein
   the forming of the oxide film includes irradiating the front surface of the wafer with plasma.

10. The manufacturing method for a semiconductor device according to claim 2, wherein the forming of the oxide film includes irradiating the front surface of the wafer with plasma.

11. The manufacturing method for a semiconductor device according to claim 9, further comprising:
forming a resist on the first electrode layer before the forming of the oxide film, wherein
the resist is removed by the irradiating with the plasma.

12. The manufacturing method for a semiconductor device according to claim 11, wherein
an upper surface of the first electrode layer exposed by removing the resist is descumming-processed by the irradiating with the plasma.

13. The manufacturing method for a semiconductor device according to claim 11, wherein
a thickness of the resist is 2 µm or more.

14. The manufacturing method for a semiconductor device according to claim 12, wherein
a thickness of the resist is 2 µm or more.

15. The manufacturing method for a semiconductor device according to claim 11, further comprising:
forming a passivation film on the first electrode layer before the forming of the resist, wherein
the resist is formed above the front surface of the wafer and inside the passivation film.

16. The manufacturing method for a semiconductor device according to claim 1, further comprising:
attaching a protective tape to a back surface of the wafer before the forming of the second electrode layer by plating.

17. The manufacturing method for a semiconductor device according to claim 16, wherein
a diameter of the protective tape is larger than a diameter of the wafer.

18. The manufacturing method for a semiconductor device according to claim 1, further comprising:
covering the outer peripheral region with a protective tape before the forming of the second electrode layer by plating.

19. The manufacturing method for a semiconductor device according to claim 1, wherein
in the forming of the second electrode layer by plating, the outer peripheral region is exposed and the wafer is immersed in a plating solution.

20. The manufacturing method for a semiconductor device according to claim 1, wherein
the first electrode layer is Al—Si, and the second electrode layer is Ni/Au.

* * * * *